United States Patent [19]

Tong

[11] Patent Number: 5,471,485
[45] Date of Patent: Nov. 28, 1995

[54] REED-SOLOMON DECODER USING DISCRETE TIME DELAY IN POWER SUM COMPUTATION

[75] Inventor: Po Tong, Fremont, Calif.

[73] Assignee: LSI Logic Corporation, Milpitas, Calif.

[21] Appl. No.: 980,944

[22] Filed: Nov. 24, 1992

[51] Int. Cl.$^6$ .................................................. H03M 13/00
[52] U.S. Cl. .................................................. 371/37.1
[58] Field of Search .................................. 371/37.6, 37.1, 371/38.1, 40.1

[56] References Cited

U.S. PATENT DOCUMENTS

| | | | |
|---|---|---|---|
| 4,680,764 | 7/1987 | Suzuki et al. | 371/40 |
| 4,763,332 | 8/1988 | Glover | 371/37.5 |
| 4,777,635 | 10/1988 | Glover | 371/40 |

FOREIGN PATENT DOCUMENTS

| | | | |
|---|---|---|---|
| 2624676 | 6/1989 | France | 371/37.5 |
| 0136587 | 4/1985 | Japan | 371/37.5 |
| 0140381 | 5/1985 | Japan | 371/37.5 |
| 0156413 | 10/1985 | Netherlands | 371/37.5 |
| 8202103 | 6/1982 | WIPO | 371/37.5 |

OTHER PUBLICATIONS

Tong, Po "A 40–MHz Encoder–Decoder Chip Generated by a Reed–Solomon Code Compiler," IEEE 1990 Custom Integrated Circuits Conference, pp. 13.5.1–13.5.4.

Primary Examiner—Stephen M. Baker
Attorney, Agent, or Firm—Townsend and Townsend and Crew

[57] ABSTRACT

A power sum computation unit for a Reed-Solomon decoder having r redundant symbols and in which a code word, R, has a first plurality (n) of symbols, each symbol having a plurality (m) of bits, including multiplier unit for multiplying in parallel M symbols by powers of a finite field element, $\alpha$, to obtain the power sums $$Si = \sum_{j=0}^{n-1} R_j \alpha^{ij}$$

for $i = 0, 1, \ldots, r-1$

The multiplier unit includes M multipliers for multiplying M symbols by powers of alpha, and memory delay including a latch, a random access memory, and a flipflop store symbols and sequentially provide M symbols to the multiplier unit. Exclusive OR gate selectively connects products from the multiplier unit and data input words to the memory delay. A counter is provided for the random access memory with the counter having a modulo number equal to one less than r/M, and the random access memory having a depth equal to one less than r/M.

5 Claims, 3 Drawing Sheets

REED-SOLOMON DECODER USING DISCRETE TIME DELAY IN POWER SUM COMPUTATION

This patent application is related to pending application Ser. No. 07/829,655 filed Feb. 3, 1992, for Serial Data Encoder, now U.S. Pat. No. 5,285,455 assigned to LSI Logic Corporation, the present assignee.

BACKGROUND OF THE INVENTION

This invention relates generally to the encoding of data for transmission and storage, more particularly the invention relates to the encoding and decoding of Reed-Solomon (RS) codes.

The trend towards higher densities and data rates in magnetic data recording has required error control coding and modulation techniques. Error detection and correction coding can use a polynomial with binary coefficients to represent a sequence of binary bits and with a plurality of check bits determined by a coding process which requires that every code word be divisible by a preselected polynomial with zero remainder. A plurality of cyclic codes can be interleaved to form a cyclic code for further error reduction. Further, the binary base field can be extended to a finite field of $2^m$ elements, known as a Galois field GF ($2^m$) in which all elements are represented by m-bit binary symbols.

The Reed-Solomon (RS) code is based on an extension of the concepts of cyclic codes in an extended binary field GF ($2^m$). All processing of these polynomials is done using sum and product operations defined in the extension field GF ($2^m$). In this system, the generator G(z), the information sequence M(z), the remainder C(z), and the code word W(z) are all polynomials whose coefficients are elements in GF($2^m$) in the form of m-bit bytes.

An (n,k) Reed-Solomon (RS) code over the finite field FG($2^m$) has k message symbols and r=n−k redundant check symbols, where each symbol is m bits wide and n=r+k=code length in symbols. The check symbols $C_{r-1}$, $C_{r-2}$ ..., $C_1$, $C_0$ are computed from the message symbols $M_{k-1}$, $M_{k-2}$ .. ., $M_1$, $M_0$ using the formula $$C(z)=M(z)z^r \text{modulo } G(z)$$

where $C(z)=C_{r-1}z^{r-1}+C_{r-2}z^{r-2}+\ldots+C_1z+C_0$ is the check polynomial, $M(z)=M_{k-1}z^{k-2}+\ldots+M_1z+M_0$ is the message polynomial and $G(z)=z^r+G_{r-1}Z^{r-1}+G_{r-2}z^{r-2}+\ldots+G_1z+G_0$ is the generator polynomial of the RS code. C(z) is the remainder when $M(z)z^r$ is divided by G(z).

The conventional parallel implementation of an RS encoder is shown in FIG. 1 in which a message and the content of a register are summed and applied through a MUX 10 to a plurality of multipliers 12 which multiply the sum by coefficients, $G_i$, with the products added to contents of registers 14 in adders 16 and then sorted in other registers 14.

In this parallel approach, a message symbol is input every clock cycle, and r finite field multiplications (by the r constant coefficients, $G_i$, of the generator polynomial) and r finite field additions are performed every clock cycle. The message select signal is high when message symbols are being input and low when the redundant check symbols are being output. The other signals in FIG. 1 are all m bits wide where m is the number of bits per symbol. In this approach, r constant finite field multipliers 12, r finite field adders 16, and r symbol registers 14 are needed.

Copending Ser. No. 07/829,655, supra., discloses an encoder including a single multiplexer and a single adder for obtaining the quotient or redundant check signals of the polynomial division, depending on whether all message symbols have been input to the encoder. The intermediate results of the computation are fed back to the discrete time delay line, controlled by a feedback control signal. The discrete time delay line delays the data by r−1 clock cycles. The output of the delay line if controlled by a sync signal which suitably initializes the delay line at the beginning of a new message block. The encoder replaces the r constant multipliers in the conventional parallel approach by a single general multiplier. all memory elements are lumped together in the single delay line. Since the delay line is implemented with a random access memory together with simple control logic, a significant reduction of hardware is realized due to the density of the RAM cells compared with registers as used in the conventional parallel encoder.

The present invention is directed to a Reed-Solomon decoder and particularly to a power sum computation unit in the decoder which uses a discrete time delay for serial computations.

SUMMARY OF THE INVENTION

In accordance with the invention the power sum computation in a Reed-Solomon decoder uses a serial/parallel network employing a random access memory as a discrete time delay.

More particularly, symbols of received data, $R_i$, are simultaneously multiplied by finite field elements, $\alpha^i$, to generate the power sum, $S_i$, in the power sum polynomial, S(z). For r redundant symbols, M symbols per word and m bits per symbol, a random access memory has a width equal to the Mxm and a depth equal to r/M−1. A latch and a flip-flop serially connected with the random access memory provide the additional depth for r/M. A speed increase of M is realized over the speed for a fully serial multiplier.

The invention and objects and features thereof will be more readily apparent from the following detailed description and appended claims when taken with the drawing.

DESCRIPTION OF THE ILLUSTRATIVE EMBODIMENTS

Figure 2:
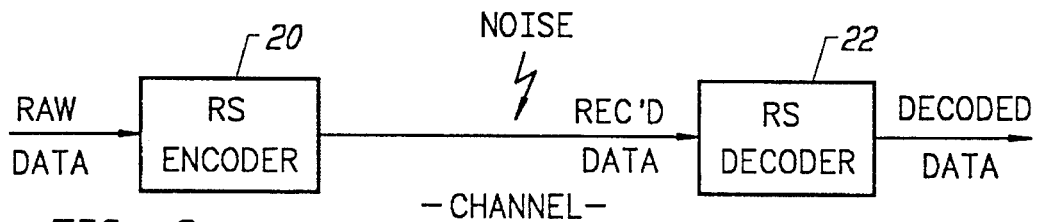
FIG. 2 is a functional block diagram of a Reed-Solomon communications link.

Referring now to FIG. 2, a Reed-Solomon communication link is illustrated. The encoder 20 provides a block code for transmission that protects a discrete-time sequence of symbols from noise introduced in the transmission channel and random errors. To every k-data symbol in the alphabet of the code, a t-error correcting code forms a code word by appending n–k=2t new symbols called parity symbols. The code word now has block length, n, and is constructed so that the original k-data symbols can be recovered even when up to t code word-symbols are corrupted by additive channel noise.

Figure 3:
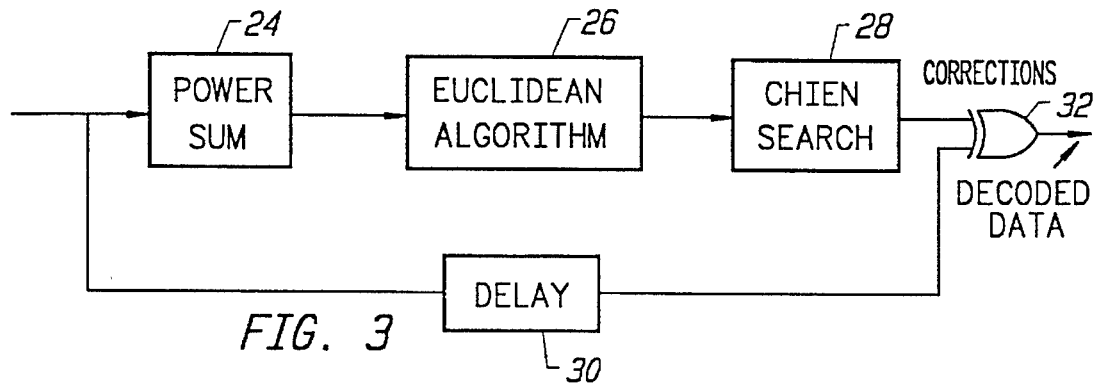
FIG. 3 is a functional block diagram of a Reed-Solomon decoder.

The block code is decoded at the receiver to reconstruct the raw data by identifying and correcting errors in the received encoded blocks of data. FIG. 3 is a functional block diagram of a Reed-Solomon decoder. The received encoded blocks of data are provided to a power sum unit 24 which generates a power sum polynomial. The polynomial is then applied to a Euclidean algorithm 26 which solves the key equation. Errors are then located by finding the roots of the error location polynomial using Chien search 28. Received data which is stored in delay unit 30 can then be corrected at exclusive OR gate 32 to provide the decoded data.

More particularly, the power sum polynomial, $$S(z) = \sum_{i=0}^{r-1} S_i z^i$$

is provided by the power sum unit 24 to the Euclidean algorithm 26. The Euclidean algorithm operates on the polynomial to solve the key equation $$S(z)\sigma(z) = \omega(z) \bmod^r$$

where $\sigma(z)$ is the error locator polynomial, $\omega(z)$ is the error evaluator polynomial, and r=redundancy in number of symbols.

Thereafter the error location is found from the roots of $\sigma(z)$ using the Chien search.

The received encoded data includes n symbols, $R_i$, or $$R_{n-1}, R_{n-2}, R_{n-3}, \ldots, R_0.$$

The received polynomial can be expressed as $$R(z) = R_{n-1} \times z^{n-1} + R^{n-2} \times z^{n-2} + \ldots + R_1 z + R_0$$

The power sums can be expressed as follows:

$$S_0 = R(z)|z = \alpha^0$$
$$S_1 = R(z)|z = \alpha^1$$
$$S_2 = R(z)|z = \alpha^2$$
$$\vdots$$
$$S_{r-1} = R(z)|z = \alpha^{r-1}$$

where $\alpha$ is a primitive element in the finite field.

The power sum series is then $S_0, S_1, \ldots, S_{r-1}$, where $$S_i = R(z)|z = \alpha^i = R(\alpha^i).$$

Figure 4:
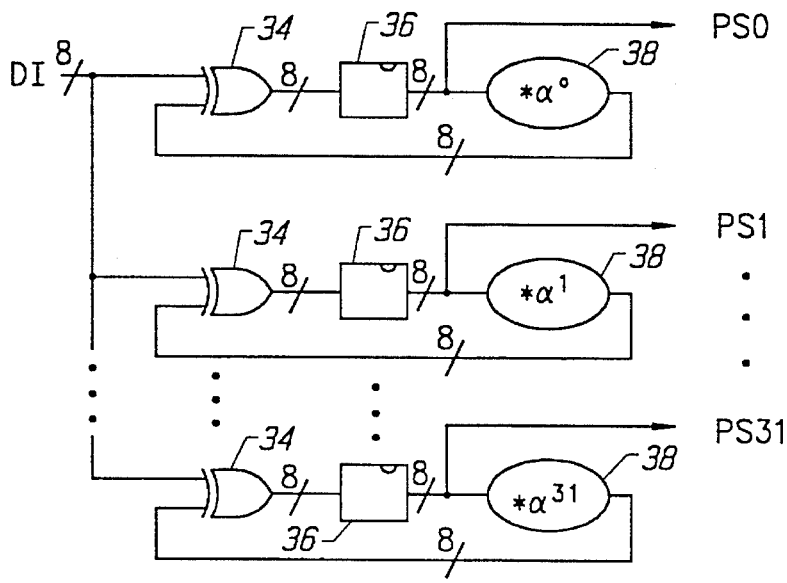
FIG. 4 is a schematic of a conventional high speed power sum computation unit.
Figure 5:
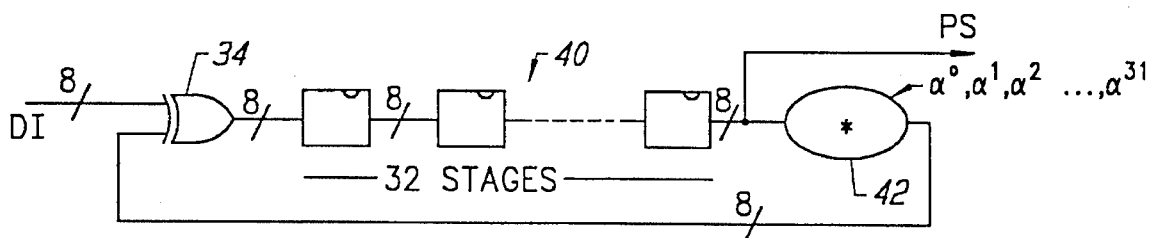
FIG. 5 is a schematic of a conventional time multiplexed slow speed power sum computation unit.

FIG. 4 and FIG. 5 are schematics of a conventional high speed power sum computation unit and a conventional time-multiplexed slow speed power sum computation unit, respectively. In FIG. 4 the data in (DI) or $R_i$, are applied in parallel to individual computation units each including an exclusive OR unit 34, a delay 36, and a multiplier 38. The multiplier units multiply by the primitive elements, $\alpha^i$, where i is 0 to r–1. Thus, for a redundancy of 32 symbols, the power sums, PS0–PS31, are obtained concurrently. While the operation is fast, the circuitry is large and complex.

In the slow speed time-multiplexed unit of FIG. 5, each data input word is passed through exclusive OR 34 and is multiplied by $\alpha^i$ serially. A 32-stage delay 40 is employed to store the bits of each input word which are sequentially multiplied in multiplier 42 by $\alpha^i$. The circuitry of FIG. 5 is much simpler in structure but is also slower in operation.

Figure 6:
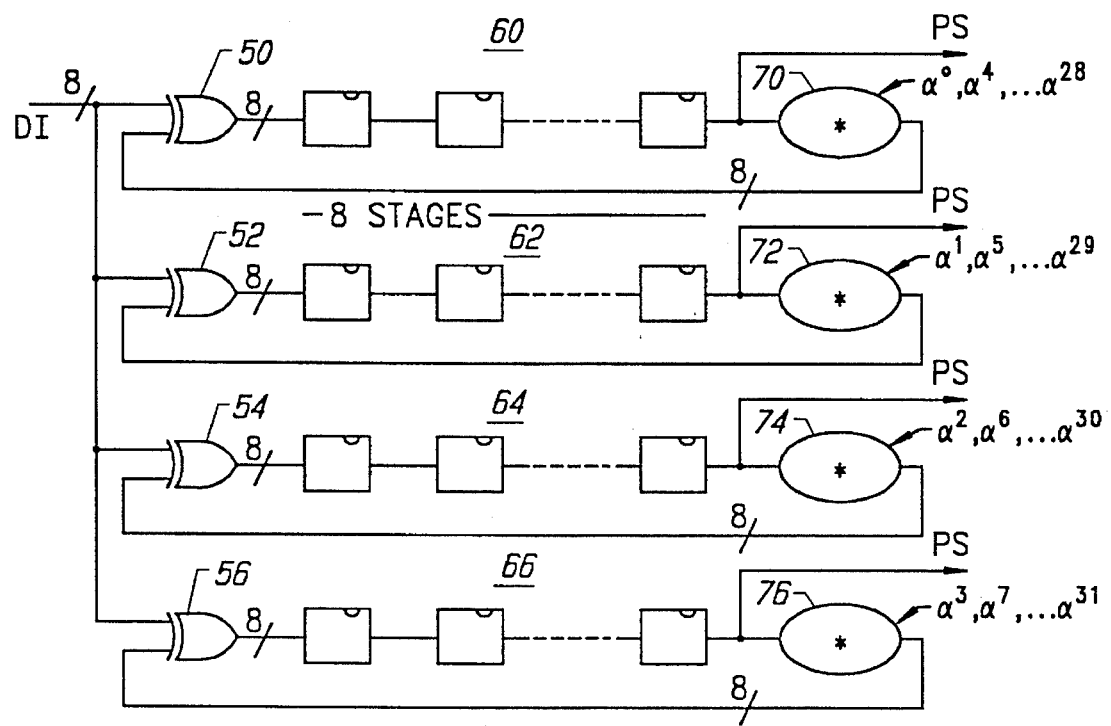
FIG. 6 is a schematic of a power sum computation unit in accordance with one embodiment of the invention.
Figure 7:
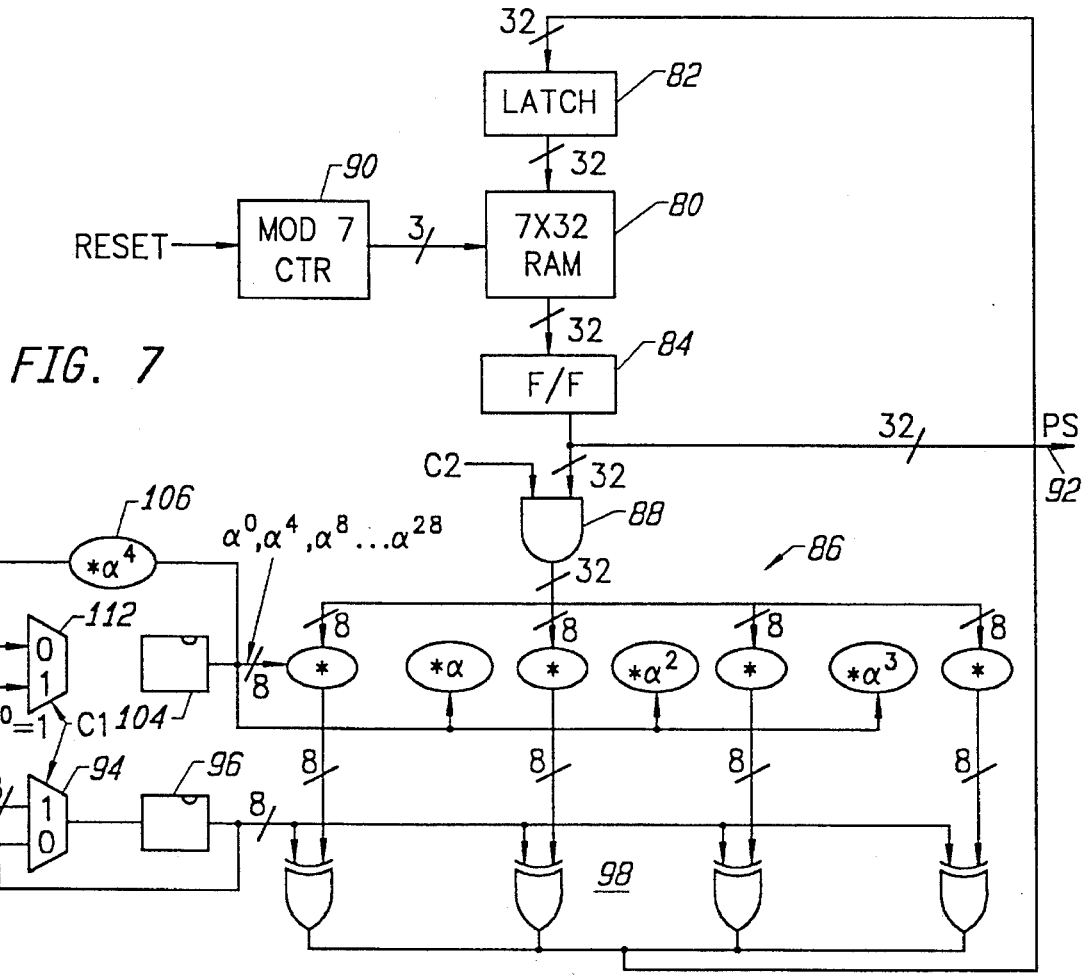
FIG. 7 is a schematic of a power sum computation unit in accordance with one embodiment of the invention.

FIG. 6 is a schematic of a power sum computation unit which includes both parallel and serial features which can be readily implemented using a random access memory delay unit as shown in the embodiment of the invention of FIG. 7. In the embodiment of FIG. 6, each input word of the input data is simultaneously applied to four exclusive OR gates 50, 52, 54, and 56 with each gate connected to an eight-stage delay line 60, 62, 64, 66 and a multiplier 70, 72, 74, 76. Each of the multipliers is assigned eight powers of the primitive element, $\alpha$, with each data word being multiplied by four different primitive elements simultaneously. Thus each data word must be cycled eight times for complete multiplication of the primitive elements.

FIG. 7 is one embodiment of the invention for implementing the circuit of FIG. 6 using a 7×32 bit random access memory 80 along with a input latch 82 and an output flipflop 84 for storing the eight data input words of 32-bits each and cycling the data words to the multiplying unit shown generally at 86 through a controlled gate 88. A modulo-seven counter 90 is employed for clocking the stored data words from RAM 80 for operation in the multiplier 86 and for the ultimate output of the power sum at 92.

The data input, DI, is applied through MUX 94 and latch 96 and through the exclusive OR gates 98 for storage in the latch 82, RAM 80, and output flipflop 84. The encoded data, $R_i$, is clocked from the memory delay means including latch 82, RAM 80, and flipflop 84 by modulo 7 counter 90 through the gate 88 to the multiplier unit 86 when the data is multiplied by powers of the primitive element, $\alpha$. The powers of $\alpha$ are provided by MUX 102, latch 104, and a feedback $\alpha^4$ multiplier 106. The powers of $\alpha$ from latch 104 are multiplied by $\alpha$, $\alpha^2$, and $\alpha^3$ in three of the multipliers of multiplying unit 86 so that multiplicands from $\alpha^0$ to $\alpha^{31}$ are provided. After power sums are completed by each received polynomial, the stored power sums are read from memory 80 on output line 92.

Figure 1:
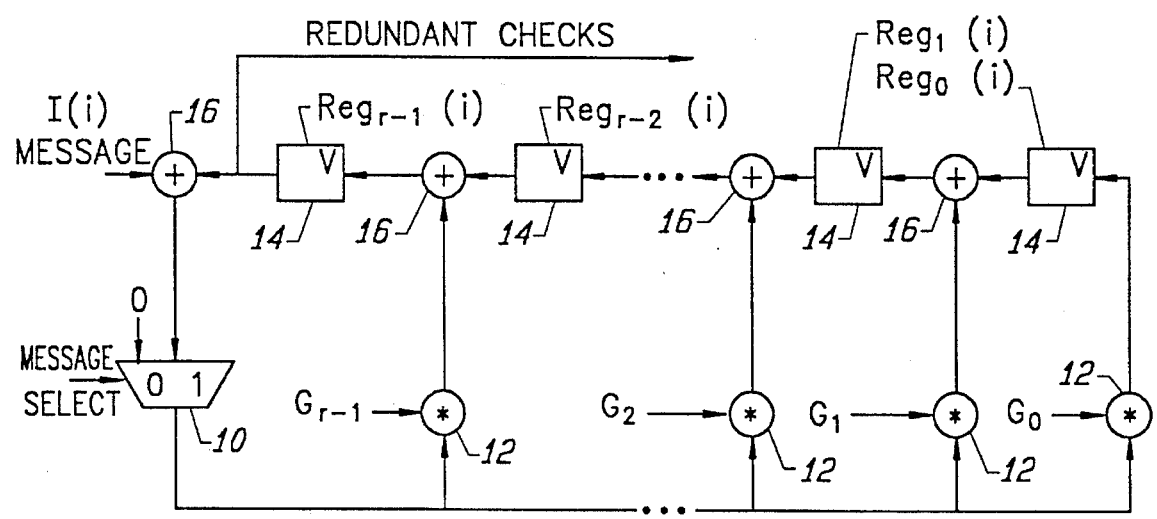
FIG. 1 is a schematic of a conventional Reed-Solomon encoder.
Figure 8A:
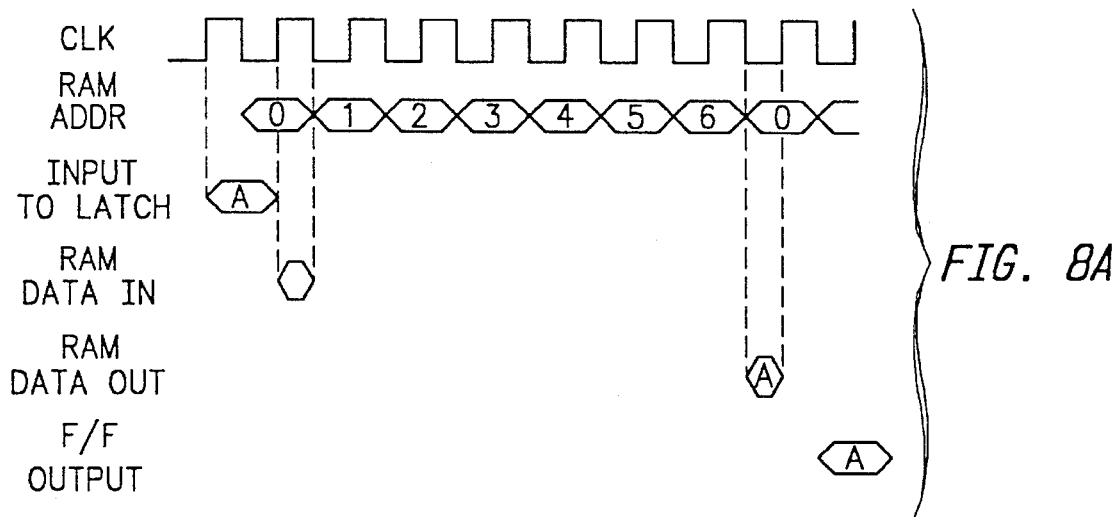
FIGS. 8A, 8B are timing diagrams for the circuit of FIG. 7.

FIG. 8A is a timing diagram for the circuitry of FIG. 7 showing the clock, RAM address, input to latch 82, RAM data in, RAM data out, and flipflop 88 output. This diagram illustrates that the latch 82 and flipflop 84 along with the modulo 7 counter give an 8 cycle delay.

Figure 8B:
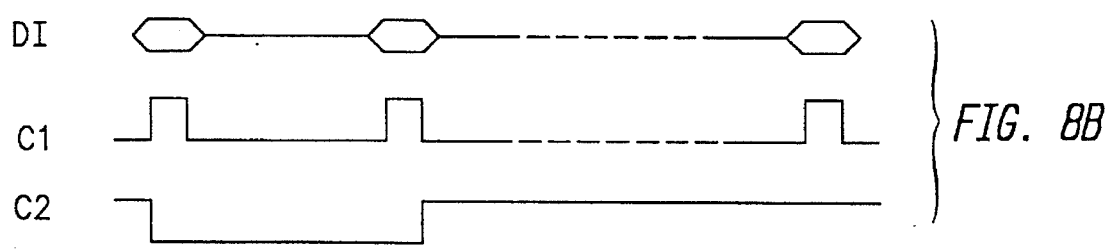

Data are written into the RAM and read out seven cycles later. The second half of a clock cycle is used for writing, and the first half of the clock cycle is used for reading. Because the address repeats once every seven cycles (mod 7 counter), the data is delayed for seven cycles in the RAM. Thus, the latch and flipflop together with the RAM provides 8 cycles of delay. In FIG. 8B, the data input (DI) and alpha ($\alpha$) values are clocked in by C1, and clock C2 forces the RAM output to $\phi$ during initialization (first pass through the RAM).

There has been described an improved power sum computation unit for use in a Reed-Solomon decoder in which discrete time delay is provided by a random access memory for the parallel and the serial computation of the power sums. While the invention has been described with reference to a specific embodiment, the description is illustrative of the invention and is not to be construed as limiting the inven-

What is claimed is:

1. A power sum computation unit for a decoder of a Reed-Solomon code having a redundancy of r symbols and m bits per symbol in which M parallel multipliers operate on M symbols simultaneously to increase computation speed by M over a symbol-serial computation speed, said power sum computation unit comprising data input means for sequentially receiving coded symbols, a plurality of exclusive OR gates equal in number to said plurality of multipliers, memory delay means having a bit width equal in number to said number of multipliers times the number of bits per symbol, and a depth equal in number to said redundancy divided by the number of multipliers, said plurality of exclusive OR gates connecting coded symbols to said memory delay means, multiplication means including said M parallel multipliers, gate means for sequentially applying said symbols stored in said memory delay means to said M parallel multipliers, means for providing powers of a finite field element, $\alpha$, from the power 0 to the power equal in number to one less than the redundancy to said multiplication means, whereby said multiplication means multiplies in parallel M symbols by said powers of said alpha, and means for applying the products from said multiplications means to said exclusive OR gates along with coded symbols to provide a power sum output from said exclusive OR gate.

2. The power sum computation unit as defined by claim 1 wherein said memory delay means comprises a latch having a bit width equal in number to Mxm, a random access memory having an input and an output, said random access memory having a bit width equal to Mxm, said latch being connected to an input of said random access memory, and a flipflop having a bit width equal in number Mxm, said flipflop being connected to the output of said random access memory.

3. The power sum computation unit as defined by claim 2 and further including a counter for said random access memory, said counter having a modulo number equal to one less than r/M, said random access memory having a depth equal to one less than r/M.

4. The power sum computation unit for a Reed-Solomon decoder in which a code word, R, comprises a first plurality, n, said power sum computation unit comprising multiplication means for multiplying in parallel said n symbols by powers of a finite field element, $\alpha$, to obtain the power sums $$Si = \sum_{j=0}^{n-1} R_j \alpha^{ij}$$

for $i = 0, 1, \ldots, r-1$ said multiplication means including M multipliers for simultaneously multiplying M symbols by powers of said finite field element, memory delay means for storing symbols and simultaneously providing M Symbols to said multiplication means, said memory delay means comprising a latch having a bit width equal in the number of symbols per word times the number of bits per symbol (Mxm), a random access memory having an input and an output, said random access memory having a bit width equal to Mxm, said latch being connected to an input of said random access memory, and a flipflop having a bit width equal to Mxm, said flipflop being connected to the output of said random access memory, and exclusive OR means for selectively connecting products from said multiplication means and data input symbols to said memory delay means.

5. The power sum computation unit as defined by claim 4 and further including a counter for said random access memory, said counter having a modulo number equal to one less than r/M, where r is the number of redundant symbols said random access memory having a depth equal to one less than r/M.

* * * * *